(12) United States Patent
Nakano et al.

(10) Patent No.: US 10,038,438 B2
(45) Date of Patent: Jul. 31, 2018

(54) POWER SEMICONDUCTOR ELEMENT DRIVING CIRCUIT

(71) Applicant: Mitsubishi Electric Corporation, Chiyoda-ku (JP)

(72) Inventors: Kosuke Nakano, Chiyoda-ku (JP); Keisuke Iwasawa, Chiyoda-ku (JP); Takayoshi Miki, Chiyoda-ku (JP); Hiroshi Nakatake, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/303,149

(22) PCT Filed: May 27, 2015

(86) PCT No.: PCT/JP2015/065257
§ 371 (c)(1),
(2) Date: Oct. 10, 2016

(87) PCT Pub. No.: WO2015/182658
PCT Pub. Date: Dec. 3, 2015

(65) Prior Publication Data
US 2017/0040992 A1    Feb. 9, 2017

(30) Foreign Application Priority Data

May 30, 2014    (JP) ................. 2014-112004

(51) Int. Cl.
*H03B 1/00*    (2006.01)
*H03K 3/00*    (2006.01)
(Continued)

(52) U.S. Cl.
CPC ....... *H03K 17/567* (2013.01); *H01L 29/1602* (2013.01); *H01L 29/1608* (2013.01);
(Continued)

(58) Field of Classification Search
CPC . H03K 17/567; H03K 17/08122; H02M 1/00; H02M 1/08; H02M 1/32; H01L 29/1602; H01L 29/1608; H01L 29/2003
(Continued)

(56) References Cited

U.S. PATENT DOCUMENTS 4,419,586 A * 12/1983 Phipps ................. H03K 17/785
250/551
4,687,956 A * 8/1987 Itoh ................... G02F 1/133382
327/108
(Continued)

FOREIGN PATENT DOCUMENTS

CN    1201291 A    12/1998
CN    102187557 A    9/2011
(Continued)

OTHER PUBLICATIONS

International Search Report dated Aug. 18, 2015, in PCT/JP2015/065257 filed May 27, 2015.
(Continued)

*Primary Examiner* — Thomas Skibinski
(74) *Attorney, Agent, or Firm* — Oblon, McClelland, Maier & Neustadt, L.L.P.

(57) ABSTRACT

A driving circuit including: a voltage detector that detects the sum voltage of a positive bias voltage and a negative bias voltage, the negative bias voltage or the positive bias voltage; and a switching element that is connected to the control terminal of a power element and the negative side of a negative-voltage power supply; wherein, when the value of the detection target voltage becomes lower than a voltage setting value or when a voltage between the control terminal and the reference terminal in the power element increases in a state where the value of the detection target voltage is lower than the voltage setting value, the voltage detector turns on the switching element to thereby supply, between
(Continued)

the above terminals in the power element, a voltage of 0V or lower.

17 Claims, 7 Drawing Sheets

(51) Int. Cl.
| | |
|---|---|
| *H03K 17/567* | (2006.01) |
| *H02M 1/00* | (2006.01) |
| *H02M 1/08* | (2006.01) |
| *H02M 7/48* | (2007.01) |
| *H01L 29/16* | (2006.01) |
| *H01L 29/20* | (2006.01) |
| *H03K 17/0812* | (2006.01) |
| *H02M 1/32* | (2007.01) |
| *H02M 7/5387* | (2007.01) |

(52) U.S. Cl.
CPC .......... *H01L 29/2003* (2013.01); *H02M 1/00* (2013.01); *H02M 1/08* (2013.01); *H02M 1/32* (2013.01); *H02M 7/48* (2013.01); *H02M 7/53875* (2013.01); *H03K 17/08122* (2013.01)

(58) Field of Classification Search
USPC ........ 327/108–112, 427, 434, 437, 530, 549, 327/379–383; 326/82, 83, 87
See application file for complete search history.

(56) References Cited

U.S. PATENT DOCUMENTS

| | | | |
|---|---|---|---|
| 5,929,665 A | | 7/1999 | Ichikawa et al. |
| 2009/0079491 A1 | * | 3/2009 | Kawamura .......... H03K 17/302 |
| | | | 327/434 |
| 2011/0204929 A1 | * | 8/2011 | Nakayama .............. H02M 1/08 |
| | | | 327/109 |
| 2013/0106499 A1 | * | 5/2013 | Yamamoto .......... H01L 27/0629 |
| | | | 327/537 |
| 2013/0214822 A1 | | 8/2013 | Sakata et al. |

FOREIGN PATENT DOCUMENTS

| | | | |
|---|---|---|---|
| EP | 2 320 544 A1 | | 5/2011 |
| JP | 62-296617 A | | 12/1987 |
| JP | 63-181964 U | | 11/1988 |
| JP | 7-131971 A | | 5/1995 |
| JP | 10-127044 A | | 5/1998 |
| JP | 2000-354303 A | | 12/2000 |
| JP | 4528321 B2 | | 8/2010 |
| JP | 2012-186605 A | | 9/2012 |
| JP | 2012186605 A | * | 9/2012 |
| JP | 2013-179828 A | | 9/2013 |
| WO | WO 2010/021082 A1 | | 2/2010 |

OTHER PUBLICATIONS

Combined Office Action and Search Report dated Feb. 24, 2018 in Chinese Patent Application No. 201580015507.7 with partial unedited computer generated English translation and English translation of categories of cited documents citing documents AO-AP therein, 21 pages.

Extended European Search Report dated Dec. 5, 2017 in Patent Application No. 15800653.6, citing documents AA, AB, and AO therein, 9 pages.

* cited by examiner

POWER SEMICONDUCTOR ELEMENT DRIVING CIRCUIT

TECHNICAL FIELD

The present invention relates to a driving circuit for driving a power semiconductor element, and in particular, relates to the driving circuit having a function of preventing breakage of the power semiconductor element due to its false operation caused by a voltage change dv/dt.

BACKGROUND ART

With respect to conventional driving circuits for power semiconductor elements, in the case where the circuit is used with a self-turn-off power semiconductor element such as an IGBT (Insulated Gate Bipolar Transistor) made of Si (Silicon), or the like, when a voltage change dv/dt occurs between collector-emitter terminals of the power semiconductor element in OFF state, the gate voltage increases due to the parasitic capacitance associated with the gate of the power semiconductor element. Thus, there is a problem that, if the gate voltage exceeds a specified threshold voltage, the power semiconductor element in OFF state is falsely turned ON to cause an arm short-circuit in a power converter such as an inverter or the like, resulting in breakage of the power semiconductor element. In order to avoid this problem, there is a method in which a negative bias voltage is applied between the gate-emitter terminals when the power semiconductor element is in OFF state.

However, with respect to the power converters such as an inverter and the like, driving power of the power semiconductor element is supplied from a power supply for the main circuit in many cases. Thus, there is a possibility that a voltage change occurs between the gate-emitter terminals before the negative bias voltage to be applied to the power semiconductor element is established, so that the gate voltage increases to cause the false operation. Meanwhile, in the case where a MOSFET (Metal-Oxide-Semiconductor Field-Effect-Transistor) is used as the power semiconductor element, if a voltage change occurs between the drain-source terminals before the negative bias voltage to be applied to the power semiconductor element is established, there is a possibility that the gate voltage increases to cause the false operation.

In Patent Document 1, a circuit (driving circuit) for driving a semiconductor element having a low threshold voltage is described. In the driving circuit of Patent Document 1, a normally-on-type FET (Field-Effect-Transistor) 132 is connected between the gate terminal and the source terminal 144 of a switching element 130 so as to short-circuit between the gate-source terminals when the power supply of a driving-pulse generation circuit 118 becomes in OFF state.

CITATION LIST

Patent Document

Patent Document 1: Japanese Patent No. 4528321 (Paragraph 0053 to Paragraph 0063, FIG. 5)

SUMMARY OF THE INVENTION

Problems to be Solved by the Invention

According to the driving circuit of Patent Document 1, it is possible to short-circuit between the gate-source terminals of the power semiconductor element at the time a voltage change dv/dt is applied to the power semiconductor element in OFF state, in order to prevent its false operation caused by a positive bias voltage charged between the gate-source terminals; however, when the negative bias voltage is applied to the power semiconductor element, this results in application of an inverse voltage between drain-source terminals as main terminals of the normally-on-type FET for short-circuiting between the gate-source terminals, so that it becomes necessary to deal with the inverse voltage according to its magnitude. Namely, it is necessary to use a normally-on-type FET having an inverse voltage-resistance characteristic, or to serially connect a diode to a normally-on-type FET.

This invention has been made to solve the problems as described above, and an object thereof is to prevent the power semiconductor element from falsely causing an ON operation (false ON) due to the voltage change dv/dt, without applying an inverse voltage between the main terminals of the switching element for preventing such a false operation of the power semiconductor element in OFF state, to thereby prevent the power semiconductor element from being broken due to the false operation.

Means for Solving the Problems

A power-semiconductor element driving circuit according to the invention comprises: a positive-voltage power supply for supplying, between a control terminal and a reference terminal in a power semiconductor element, a positive bias voltage; a negative-voltage power supply whose positive side is connected to a negative side of said positive-voltage power supply, for supplying between the control terminal and the reference terminal in the power semiconductor element, a negative bias voltage, y; a gate driving circuit that supplies, based on a control signal of a control circuit, either the positive bias voltage for turning on the power semiconductor element or the negative bias voltage for turning off the power semiconductor element, between the control terminal and the reference terminal in the power semiconductor element; a voltage detector that detects a detection target voltage that is a sum voltage of the positive bias voltage and the negative bias voltage, the negative bias voltage or the positive bias voltage; and a switching element that is connected to the control terminal of the power semiconductor element and a negative side of the negative-voltage power supply. The voltage detector is characterized in that it turns on the switching element to thereby supply, between the control terminal and the reference terminal in the power semiconductor element, a voltage of 0V or lower, when a value of the detection target voltage becomes lower than a voltage setting value or when a voltage between the control terminal and the reference terminal in the power semiconductor element increases in a state where the value of the detection target voltage is lower than the voltage setting value.

Effect of the Invention

In accordance with the power-semiconductor element driving circuit according to this invention, it comprises the switching element that is connected to the control terminal of the power semiconductor element and the negative side of the negative-voltage power supply. Thus, if the voltage change dv/dt is applied, because the switching element is turned on without an inverse voltage being applied between the main terminals of the switching element, it is possible to prevent the false operation caused by a positive bias voltage charged between the control terminal and the reference terminal of the power semiconductor element in OFF state, to thereby prevent a phenomenon that the power semiconductor element is broken due to the false operation.

MODES FOR CARRYING OUT THE INVENTION

Embodiment 1

Figure 1:
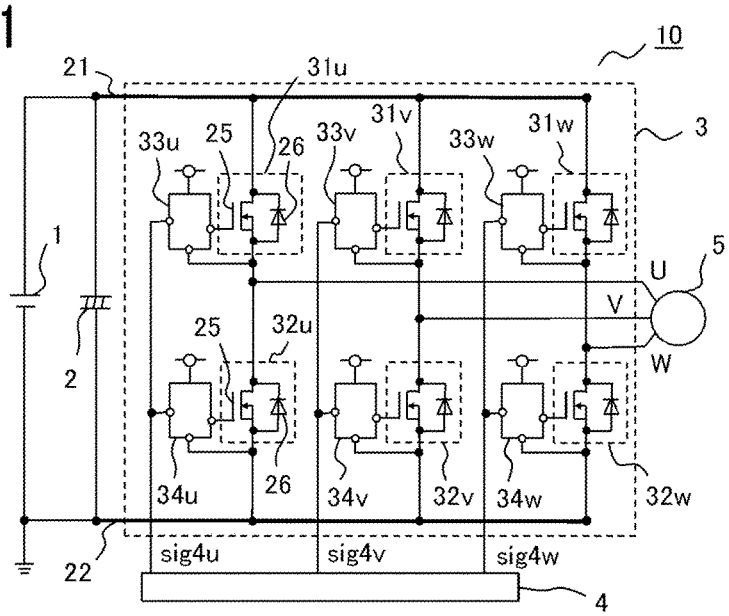
FIG. 1 is a schematic diagram of an electric drive system according to Embodiment 1 of the invention.
Figure 2:
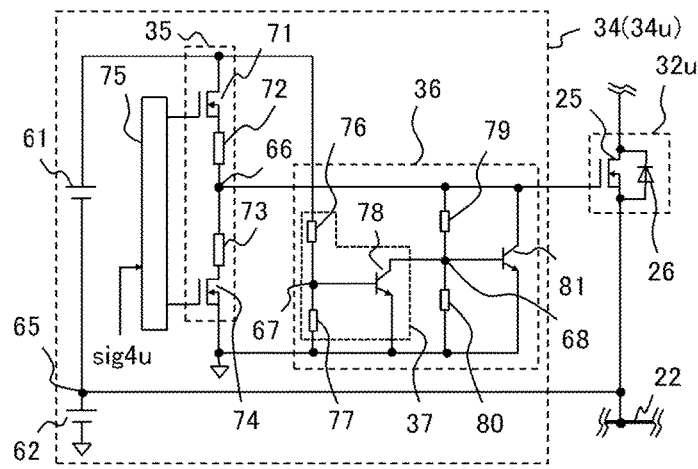
FIG. 2 is a circuit diagram showing a first driving circuit according to Embodiment 1 of the invention.
Figure 3:
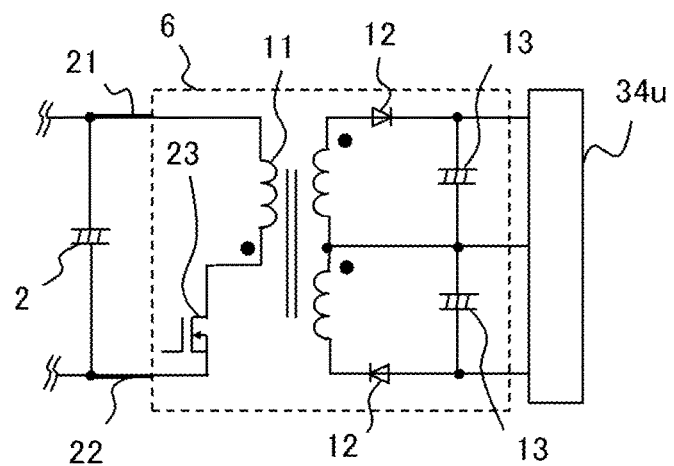
FIG. 3 is a diagram showing an insulated power supply for supplying power to a driving circuit in FIG. 1.

FIG. 1 is a schematic diagram of an electric drive system according to Embodiment 1 of the invention. FIG. 2 is a circuit diagram showing a first driving circuit according to Embodiment 1 of the invention, and FIG. 3 is a diagram showing an insulated power supply for supplying power to a driving circuit in FIG. 1. Here, description will be made about a case where an n-type MOSFET is used as a power semiconductor element in the main circuit of an electric drive system 10.

The electric drive system 10 is configured with a DC power supply 1, a smoothing capacitor 2, a motor driving device 3, a motor-drive control circuit 4 and a motor 5. Although description is herein made about a case where the DC power supply 1 is used as the power supply of the main circuit, this is not limitative. An AC power supply may be used in combination with rectification, as a DC power supply.

A voltage from the DC power supply 1 is smoothed by the smoothing capacitor 2 and is then supplied to the motor 5 after being converted into a three-phase alternating power by the motor driving device 3. On this occasion, the motor-drive control circuit 4 controls the operations of the motor driving device 3 in order to control the rotation frequency and the torque of the motor 5. The motor driving device 3 includes high potential-side semiconductor elements (upper arms) 31u, 31v, 31w and low potential-side semiconductor elements (lower arms) 32u, 32v, 32w, in a manner corresponding to the respective phases of a U-phase, a V-phase and a W-phase. The high potential-side semiconductor elements (upper arms) 31u, 31v, 31w perform on/off switching between a high potential-side bus line 21 placed at the high potential side and respective phase lines of the U-phase, the V-phase and the W-phase. The low potential-side semiconductor elements (lower arms) 32u, 32v, 32w perform on/off switching between a low potential-side bus line 22 placed at the low potential side and the respective phase lines. Where appropriate, the high potential-side semiconductor element is referred to as the upper arm and the low potential-side semiconductor element is referred to as the lower arm. Further, the motor driving device 3 includes high potential-side driving circuits 33u, 33v, 33w corresponding to the respective upper arms 31u, 31v, 31w, and low potential-side driving circuits 34u, 34v, 34w corresponding to the respective lower arms 32u, 32v, 32w.

The motor-drive control circuit 4 outputs a control signal sig4u to the high potential-side driving circuit 33u and the low potential-side driving circuit 34u. The high potential-side driving circuit 33u and the low potential-side driving circuit 34u operate complementary to each other. Namely, when the high potential-side driving circuit 33u turns on the upper arm 31u, the low potential-side driving circuit 34u turns off the lower arm 32u. When the high potential-side driving circuit 33u turns off the upper arm 31u, the low potential-side driving circuit 34u turns on the lower arm 32u. Likewise, the motor-drive control circuit 4 outputs a control signal sig4v to the high potential-side driving circuit 33v and the low potential-side driving circuit 34v, and outputs a control signal sig4w to the high potential-side driving circuit 33w and the low potential-side driving circuit 34w.

Further, in general, with respect to agate driving power supply for supplying power to the high potential-side driving circuits 33u, 33v, 33w and the low potential-side driving circuits 34u, 34v, 34w, the power is produced from a voltage charged in the smoothing capacitor 2 by way of an insulated power supply 6 as shown in FIG. 3, or the like. Such a connection of the insulated power supply 6 is publicly known by a person skilled in the art, so that, in FIG. 1, the insulated power supply 6 is omitted from illustration. The insulated power supply 6 includes, for example, a semiconductor element 23, a transformer 11, two diodes 12 and two smoothing capacitors 13. The insulated power supply 6 can vary the voltage according to the on-time of the semiconductor element 23 and the turn ratio of the transformer 11.

The driving circuit of Embodiment 1 will be described using FIG. 2. Because the respective arms of the upper arms 31u, 31v, 31w and the lower arms 32u, 32v, 32w are in common with each other, the detail description of the driving circuit will be made about the low potential-side driving circuit 34u as a representative of them. With respect to the reference numeral for the low potential-side driving circuits, numeral 34 is used collectively, and numerals 34u, 34v, 34w are used when they are to be described distinctively. With respect to the reference numeral for the high potential-side driving circuits, numeral 33 is used collectively, and numerals 33u, 33v, 33w are used when they are to be described distinctively. Further, the low potential-side driving circuit 34 and the high potential-side driving circuit 33 are the same in their circuit configurations, so that, where appropriate, the low potential-side driving circuit 34 is referred to simply as a driving circuit 34. The low potential-side driving circuit 34u includes a second DC power supply 61, a third DC power supply 62, a low-threshold countermeasure circuit 36, a gate driving circuit 35 and a buffer circuit 75. Note that the second DC power supply 61 corresponds to the upper-side smoothing capacitor 13 in the insulated power supply 6 in FIG. 3, and the third DC power supply 62 corresponds to the lower-side smoothing capacitor 13 in the insulated power supply 6 in FIG. 3. The second DC power supply 61 is a positive-voltage power supply for supplying a positive bias voltage, between a gate terminal (control terminal) and a source terminal (reference terminal) in each of the power semiconductor elements that are the upper arms 31u, 31v, 31w and the lower arms 32u, 32v, 32w. The third DC power supply 62 is a negative-voltage power supply for supplying a negative bias voltage, between a gate terminal (control terminal) and a source terminal (reference terminal) in each of the power semiconductor elements that are the upper arms 31u, 31v, 31w and the lower arms 32u, 32v, 32w.

A connection point 65 at which the negative side of the second DC power supply 61 and the positive side of the third DC power supply 62 are connected to each other, is connected to the source-terminal side of the lower arm 32u in the main circuit, namely, to the low potential-side bus line 22 in FIG. 2. The gate driving circuit 35 includes an FET 71, a resistor 72, a resistor 73 and an FET 74 that are serially connected. The FET 71 is a positive-side transistor and the FET 74 is a negative-side transistor. The low-threshold countermeasure circuit 36 includes transistors 78, 81 and resistors 76, 77, 79, 80. The positive side of the second DC power supply 61 is connected to a drain terminal of the FET 71 that constitutes the gate driving circuit 35, and a connection point between them is connected to one end of the resistor 76 in the low-threshold countermeasure circuit 36. The other end of the resistor 76 is connected to one end of the resistor 77, and the other end of the resistor 77 is connected to the negative side of the third DC power supply 62. Note that in FIG. 2, triangle symbols, one of which is put on the negative side of the third DC power supply 62, indicate that they are at the same potential. The same also applies to triangle symbols in other figures.

The source terminal of the FET 71 is connected to one end of the resistor 72, the other end of the resistor 72 is connected to one end of the resistor 73, and a connection point 66 between the resistors is connected to the gate terminal of the lower arm 32u. The other end of the resistor 73 is connected to the drain terminal of the FET 74, and the source terminal of the FET 74 is connected to the negative side of the third DC power supply. The gate terminals of the FET 71 and the FET 74 are connected to the buffer circuit 75. The buffer circuit 75 transmits the control signal sig4u from the motor-drive control circuit 4 to the FET 71 and the FET 74.

A connection point 67 between the resistor 76 and the resistor 77 is connected to the base terminal of the transistor 78. The emitter terminal of the transistor 78 is connected to the negative side of the third DC power source 62. One end of the resistor 79 and one end of the resistor 80 are connected to each other, and a connection point 68 therebetween is connected to the base terminal of the transistor 81 and to the collector terminal of the transistor 78. The other end of the resistor 79 and the collector terminal of the transistor 81 are connected to the gate terminal of the lower arm 32u. The emitter terminal of the transistor 81 and the other end of the resistor 80 are connected to the negative side of the third DC power supply 62. The resistors 76, 77 and the transistor 78 constitute a voltage detection circuit 37. The voltage detection circuit 37 in FIG. 2 detects a sum voltage of the second DC power supply 61 and the third DC power supply 62.

Next, operations of the driving circuit will be described. First, description will be made about the operations at a normal time, namely, when the sum voltage value of the second DC power supply 61 and the third DC power supply 62 is a specified value or more. When the control signal sig4u indicative of a turn-on order for the low-potential side driving circuit 34u, is inputted from the motor-drive control circuit 4 to the gate driving circuit 35 through the buffer circuit 75, the FET 71 is turned on. At this time, the FET 74 is in OFF state. When the FET 71 is turned on, the positive bias voltage is charged from the second DC power supply 61 through the resistor 72 into an input capacitance between the gate-source terminals of the lower arm 32u, so that the lower arm 32u is turned on. The turn-on speed of the lower arm 32u can be adjusted by adjusting the value of the resistor 72.

Then, when the control signal sig4u indicative of a turn-off order is inputted from the motor-drive control circuit 4, the FET 71 is turned off and the FET 74 is turned on. When the FET 74 is turned on, the negative bias voltage is charged from the third DC power supply 62 through the resistor 73 into the input capacitance between the gate-source terminals of the lower arm 32u, so that the lower arm 32u is turned off. The turn-off speed of the lower arm 32u can be adjusted by adjusting the value of the resistor 73.

When the lower arm 32u is in OFF state, in a charged condition in which the sum voltage value of the second DC power supply 61 and the third DC power supply 62 is the specified value or more, the negative bias voltage is continued to be applied between the gate and the source of the lower arm 32u, even if the voltage change dv/dt is applied between the drain-source terminals of the lower arm 32u because of a recovery operation of a diode 26 connected in inverse parallel with the semiconductor element 25 of the lower arm 32u. Because the negative bias voltage is applied between the gate and the source of the lower arm 32u, the voltage increase therebetween is reduced promptly if the voltage between the gate-source terminals of the lower arm 32u increases. Thus, the voltage between the gate and the source of the lower arm 32u is suppressed to be lower than the threshold voltage of the lower arm 32u, so that the lower arm 32u can be kept in OFF state. Accordingly, even if the voltage change dv/dt is applied between the drain-source terminals in the lower arm 32u in OFF state, there is no case where the lower arm 32u is falsely turned on (becomes a state of false ON), so that it is possible to prevent the lower arm 32u and the upper arm 31u from being broken due to such false ON.

Operations of the low-threshold countermeasure circuit 36 at this time will be described in detail. When the voltage value of the second DC power supply is defined as V61, the voltage value of the third DC power supply is defined as V62 and the resistance values of the resistors 76, 77 are defined as R76 and R77, respectively, the base-emitter voltage Vbe78 that is a voltage between the base and the emitter of the transistor 78 is represented as in a formula (1).

$$Vbe78 = R77 * (V61 + V62) / (R76 + R77) \qquad (1)$$

The resistance values R76, R77 of the resistors 76, 77 are selected so that the transistor 78 is placed in ON state when the sum of the voltage V61 and the voltage V62 is the specified value or more. When the transistor 78 is turned on, zero voltage is applied between the base-emitter terminals of the transistor 81, so that the transistor 81 is turned off, namely, the transistor 81 is placed in the OFF state. On this occasion, because the transistor 81 is turned off, the gate terminal of the lower arm 32u is controlled by the gate driving circuit 35, and thus the transistor gives no influence to the switching operation of the lower arm 32u.

Next, description will be made about the operations of the driving circuit in an abnormal state, namely, in a state where the sum voltage of the second DC power supply 61 and the third DC power supply 62 decreases due to power outage or the like, to fall below the specified value. In this case, the voltage between the base and the emitter of the transistor 78 in the low-threshold countermeasure circuit 36 decreases, so that the transistor 78 becomes in OFF state. When the transistor 78 is in OFF state, a voltage that is resistor-divided from the voltage between the connection point 66 and the negative side of the third DC power supply 62, is applied between the base-emitter terminals of the transistor 81. Accordingly, when the lower arm 32u is in OFF state, zero voltage is applied between the base-emitter terminals of the transistor 81.

Meanwhile, when the lower arm 32u is in OFF state and the transistor 78 is in OFF state, if, due to the voltage change dv/dt between the drain-source terminals of the lower arm 32u, the voltage between the gate-source terminals thereof increases, this voltage is applied to the connection point 66-side that is the high potential-side of the resistor 79 and to the negative side of the third DC power supply 62 that is the low potential-side of the resistor 80. When the resistance value of the resistor 79 is very much smaller than the resistance value of the resistor 80 (resistance value of the resistor 79<<resistance value of the resistor 80), the major portion of the increased voltage is applied between the base-emitter terminals of the transistor 81, so that the transistor 81 is turned on. When the transistor 81 is turned on, a following path A is established. The path A is that passing through the gate terminal of the lower arm 32u, the transistor 81, the negative side of the third DC power supply 62, the positive side of the third DC power supply 62 and the source terminal of the lower arm 32u. Because the path A is established when the lower arm 32u is in OFF state, it is possible to keep a state where a negative voltage is applied between the gate-source terminals of the lower arm 32u in the main circuit, or to get a state where a nearly-zero voltage is applied therebetween.

When the transistor 81 is turned on and the path A is established, if there remains the voltage from the third DC power supply 62, it is possible to apply the negative voltage to thereby keep the state where the negative voltage is applied between the gate-source terminals of the lower arm 32u. Further, when the transistor 81 is turned on and the path A is established, if the third DC power supply 62 provides zero voltage, zero voltage is applied between the gate-source terminals of the lower arm 32u, and thus it is possible to get the state where zero voltage is applied between the gate-source terminals of the lower arm 32u.

Figure 4:
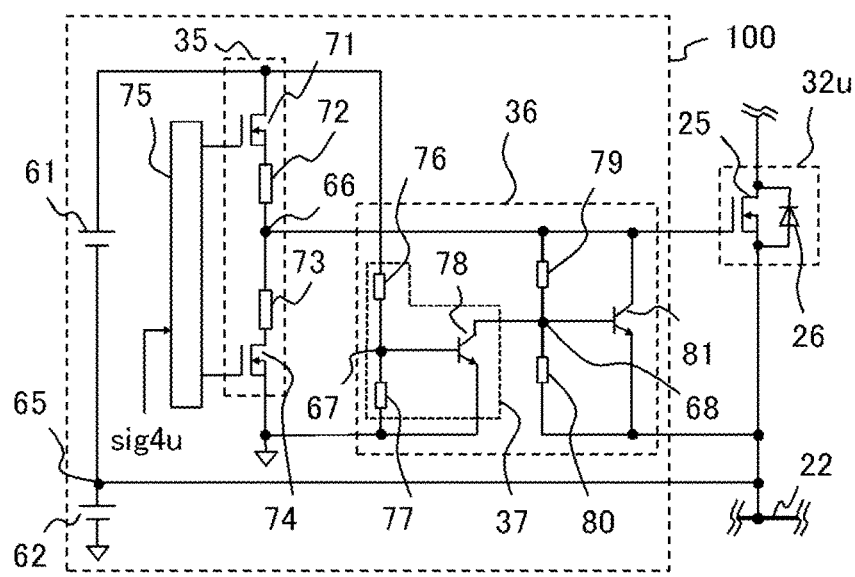
FIG. 4 is a circuit diagram showing a driving circuit as a comparative example relative to the driving circuit in FIG. 2.

The driving circuit of Embodiment 1 will be described in comparison with a conventional driving circuit. FIG. 4 is a circuit diagram showing a driving circuit as a comparative example relative to the driving circuit in FIG. 2. In FIG. 4, like in the conventional case, the emitter terminal of the transistor 81 is connected to the source terminal of the lower arm 32u. According to the driving circuit 100 as the comparative example, if the transistor 81 is turned on, it is unable to apply a negative voltage to the gate terminal and the source terminal of the lower arm 32u. In contrast, according to the driving circuit 34 of Embodiment 1, when the transistor 81 is turned on, a negative voltage can be applied between the gate-source terminals of the lower arm 32u. As will be described later, this allows to decrease a discharge limit voltage with respect to the voltage between the gate-source terminals of the lower arm 32u. Thus, according to the driving circuit 34 of Embodiment 1, in the abnormal state where the sum voltage value of the second DC power supply 61 and the third DC power supply 62 falls below the specified value, if the voltage change dv/dt is applied, the increase in the gate voltage of the lower arm 32u is reduced, so that the lower arm 32u can be prevented from causing its false operation. According to the driving circuit 34 of Embodiment 1, because of the operation of the low-threshold countermeasure circuit 36, the voltage increase between the gate-source terminals of the lower arm 32u is reduced, and the transistor 81 is turned off after the voltage value is resumed. In the abnormal state where the sum voltage value of the second DC power supply 61 and the third DC power supply 62 falls below the specified value, when the transistor 78 is in OFF state, the above operations will be continued constantly. Note that, so far, the description has been made about the operations when the sum voltage value of the second DC power supply 61 and the third DC power supply 62 falls below the specified value; however, the driving circuit 34 of Embodiment 1 is also effective at the time of initial charging or the like.

In the power-semiconductor element driving circuit 34 of Embodiment 1, since the emitter terminal of the transistor 81 is connected to the negative end of the third DC power supply 62, even when a negative voltage is applied to the gate terminal of the lower arm 32u, no inverse voltage is applied between the main terminals, that is, the collector-emitter terminals, of the transistor 81. Thus, it is unnecessary to insert a diode in series with the transistor 81, or to do something like that. When the diode is inserted, a forward voltage of the diode emerges between the gate and the source of the lower arm 32u, and thus the discharge limit voltage between the gate-source terminals of the lower arm 32u has to be higher. In contrast, in the driving circuit 34 of Embodiment 1, there is no diode serially connected to the transistor 81, so that the discharge limit voltage between the gate-source terminals of the lower arm 32u is allowed to be lower.

It should be noted that the low-threshold countermeasure circuit 36 for preventing the false ON of the lower arm 32u, shown in Embodiment 1, is an example. It just has to fulfill an ability of preventing the false ON of the lower arm 32u induced by the voltage change dv/dt, and thus, it may be configured by using transistors 81 in multi-parallel connection, or by connecting to the drain terminal or the source terminal of the transistor 81, a resistor for limiting current having a resistance in a degree that does not cause the lower arm 32u to be broken by its false turning on even when the voltage change dv/dt is applied.

As described above, according to the driving circuit 34 in Embodiment 1, since the transistor 81 that is the switching element is connected between the gate terminal of the lower arm 32u and the negative side of the third DC power supply 62, it is possible to prevent the false operation of the power semiconductor element such as the lower arm 32u or the upper arm 31u, in spite of using the switching element for which no inverse voltage-resistance characteristic is required, to thereby achieve a function of preventing the power semiconductor element from being broken due to the false operation.

Figure 5:
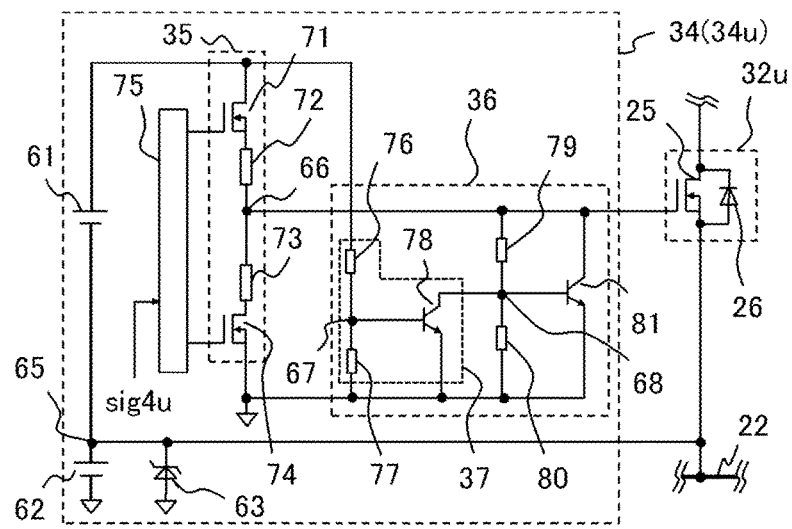
FIG. 5 is a circuit diagram showing a second driving circuit according to Embodiment 1 of the invention.

As shown in FIG. 5, it is desired that, in the driving circuit 34, a diode 63 be connected in inverse parallel with the third DC power supply 62. FIG. 5 is a circuit diagram showing the second driving circuit according to Embodiment 1 of the invention. As the diode 63, a diode with a small voltage drop is desired, and an SBD (Schottky barrier Diode) is suitable. When the second DC power supply 61 or the third DC power supply 62 becomes abnormal, movement of electric charge occurs, so that, depending on the situation, the voltage polarity of the third DC power supply 62 is inverted. The connection of the diode 63 in inverse parallel with the third DC power supply 62 makes it possible to surely prevent the inversion of the voltage polarity of the third DC power supply 62. Even in the second driving circuit 34, when the voltage of the second DC power supply 61 or the voltage of the third DC power supply 62 becomes abnormal, the transistor 78 is turned off, and thus the transistor 81 will be turned on when, for example, the voltage change dv/dt occurs between the drain-source terminals of the lower arm 32u in OFF state, so that the voltage between the gate and the source of the lower arm 32u increases. In such an abnormal state, the path A is established that passes through the gate of the lower arm 32u, the transistor 81, the negative end of the third DC power supply 62, the positive end of the third DC power supply 62 and the source terminal of the lower arm 32u. According to the second example of the driving circuit 34 of Embodiment 1, the inversion of the voltage polarity of the third DC power supply 62 is surely prevented, so that it is possible to obtain such an effect that a positive bias voltage is surely prevented from being applied between the gate-source terminals of the lower arm 32u.

Figure 6:
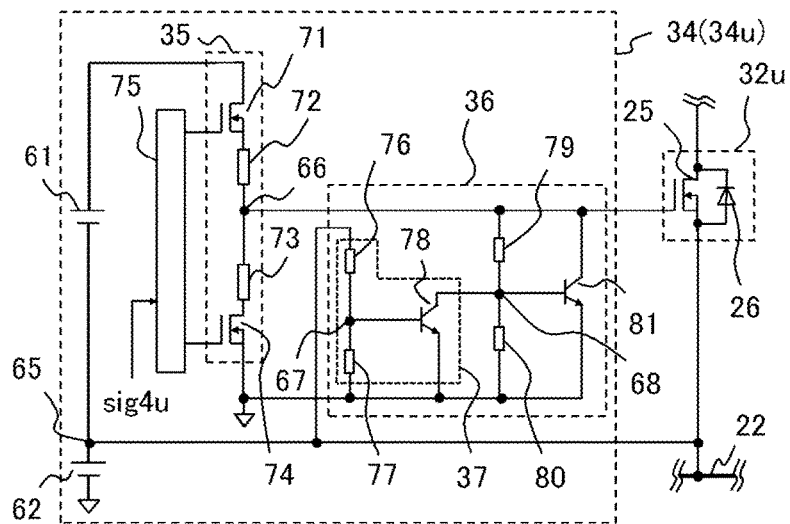
FIG. 6 is a circuit diagram showing a third driving circuit according to Embodiment 1 of the invention.

Further, the driving circuit 34 of Embodiment 1 may have another configuration. FIG. 6 is a circuit diagram showing a third driving circuit according to Embodiment 1 of the invention. In the first driving circuit 34 in FIG. 2, one end of the resistor 76 is connected to the positive side of the second DC power supply 61; however, as shown in FIG. 6, said one end of the resistor 76 may be connected to the connection point 65 between the negative side of the second DC power supply and the positive side of the third DC power supply 62, to thereby detect only the voltage value of the third DC power supply 62. When only the voltage value of the third DC power supply is detected, the power loss at the resistors 76, 77 can be reduced. Thus, according to the third example of the driving circuit 34 of Embodiment 1, it is possible to obtain such an effect that the resistor 76 and the resistor 77 can be downsized.

Figure 7:
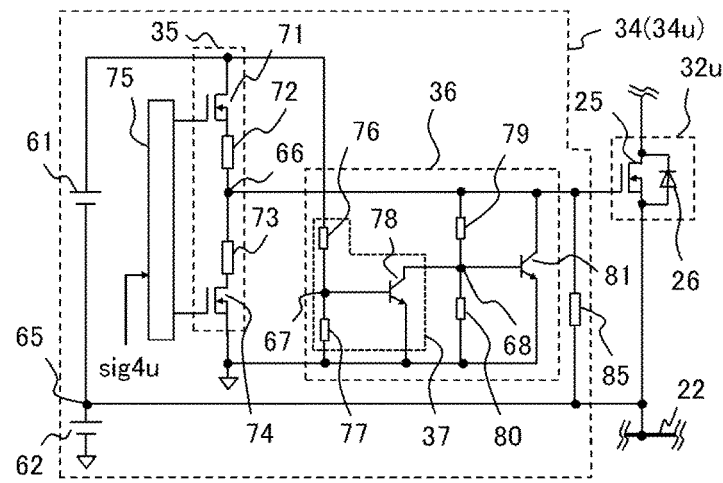
FIG. 7 is a circuit diagram showing a fourth driving circuit according to Embodiment 1 of the invention.

Further, the driving circuit 34 of Embodiment 1 may have still another configuration. FIG. 7 is a circuit diagram showing a fourth driving circuit according to Embodiment 1 of the invention. As shown in FIG. 7, a resistor 85 may be inserted between the gate-source terminals of the lower arm 32u. In FIG. 7, even when the transistor 81 is turned off and a voltage remains between the gate-source terminals of the lower arm 32u, the residual electric charge in the parasitic capacitance of the lower arm 32u is discharged through the resistor 85, so that it is allowed to decrease the discharge limit voltage to zero voltage. According to the fourth example of the driving circuit 34 of Embodiment 1, because of the connection of the resistor 85 between the gate terminal and the source terminal of the lower arm 32u, it is possible to obtain such an effect that it is allowed to decrease the discharge limit voltage at the time the low-threshold countermeasure circuit 36 operates.

Note that the driving circuit 34 of Embodiment 1 may be another modified example. In the voltage detection circuit 37, a resistor may be inserted between the connection point 67 of the resistor 76 and the resistor 77 and the base terminal of the transistor 78. Likewise, in the low-threshold countermeasure circuit 36, a resistor may be inserted between the connection point 68 of the resistor 79 and the resistor 80 and the base terminal of the transistor 81. In order to prevent a false operation due to electromagnetic noise, a capacitor may be inserted between the base terminal and the emitter terminal of the transistor 78. A capacitor may be inserted between the base terminal and the emitter terminal of the transistor 81. The configuration of each of the semiconductor elements shown here is an example, and the semiconductor element is not limited thereto. The transistor 78 or 81 used in the low-threshold countermeasure circuit 36 may be replaced with an FET, and the FET 71 or 74 in the gate driving circuit 35 may be replaced with a bipolar transistor.

Further, the description has been made about the case where an n-type MOSFET is used as the power semiconductor element in the main circuit of the electric drive system 10; however, the power semiconductor element is not limited thereto. The power semiconductor element just has to have a switching function, and a bipolar transistor or an IGBT may be used as that element. The diode 26 connected in inverse parallel with the semiconductor element 25 has been shown as a body diode of the MOSFET; however, it is not limited thereto. The diode 26 just has to have a function of allowing current flow in the opposite direction, so that an SBD or a PN junction diode may be used in parallel with the MOSFET, or an MOSFET synchronous rectification may be used.

As the semiconductor element shown as the semiconductor element 25 with the diode 26, although an element using Si semiconductor may be used, an element using a wide bandgap semiconductor, whose semiconductor material is a wide bandgap semiconductor material, may also be used. Examples of the wide bandgap semiconductor material include silicon carbide, and other than that, a gallium nitride-base material and diamond. Since the wide bandgap semiconductor is operable at a high temperature, it is possible to simplify the cooling system such as a heatsink or the like, to thereby downsize the device. When the wide bandgap semiconductor is used, this makes it possible to use the power semiconductor element with a low on-resistance, so that a low power-loss power convertor can be configured.

As described above, the driving circuit 34 of Embodiment 1 comprises: a positive-voltage power supply (second DC power supply 61) for supplying, between a control terminal and a reference terminal in a power semiconductor element (lower arm 32u), a positive bias voltage; a negative-voltage power supply (third DC power supply 62) whose positive side is connected to the negative side of the positive-voltage power supply (second DC power supply 61), for supplying, between the control terminal and the reference terminal in the power semiconductor element (lower arm 32u), a negative bias voltage; the gate driving circuit 35 that supplies, based on the control signal sig4u of a control circuit (motor-drive control circuit 4), either the positive bias voltage for turning on the power semiconductor element (lower arm 32u) or the negative bias voltage for turning off the power semiconductor element (lower arm 32u), between the control terminal and the reference terminal in the power semiconductor element (lower arm 32u); a voltage detector (voltage detection circuit 37) that detects a detection target voltage that is a sum voltage of the positive bias voltage and the negative bias voltage, the negative bias voltage or the positive bias voltage; and a switching element (transistor 81) that is connected to the control terminal of the power semiconductor element (lower arm 32u) and the negative side of the negative-voltage power supply (third DC power supply 62). The voltage detector (voltage detection circuit 37) in the driving circuit 34 of Embodiment 1 is characterized in that it turns on the switching element (transistor 81)

to thereby supply, between the control terminal and the reference terminal in the power semiconductor element (lower arm 32u), a voltage of 0V or lower, when the voltage between the control terminal and the reference terminal in the power semiconductor element (lower arm 32u) increases in a state where the value of the detection target voltage is lower than a voltage setting value. Thus, if the voltage change dv/dt is applied, because the switching element (transistor 81) is turned on without an inverse voltage being applied between the main terminals (between the collector-emitter terminals) of the switching element (transistor 81), it is possible to prevent the false operation caused by a positive bias voltage charged between the control terminal and the reference terminal of the power semiconductor element (lower arm 32u) in OFF state, to thereby prevent a phenomenon that the power semiconductor element (lower arm 32u) is broken due to the false operation, even without using an element having an inverse voltage-resistance characteristic as the switching element (transistor 81). The ON-drive voltage of the power semiconductor element is in a range approximately from +10 V to +20 V, and is typically +15 V. The OFF-drive voltage is in a range approximately from −5 V to −20 V, and is typically −10 V. An inverse voltage-resistance characteristic that can withstand a voltage of at least −5 V is required for its components, and depending on the situation, an inverse voltage-resistance characteristic that can withstand a voltage of −20 V is required therefor.

Embodiment 2

Figure 8:
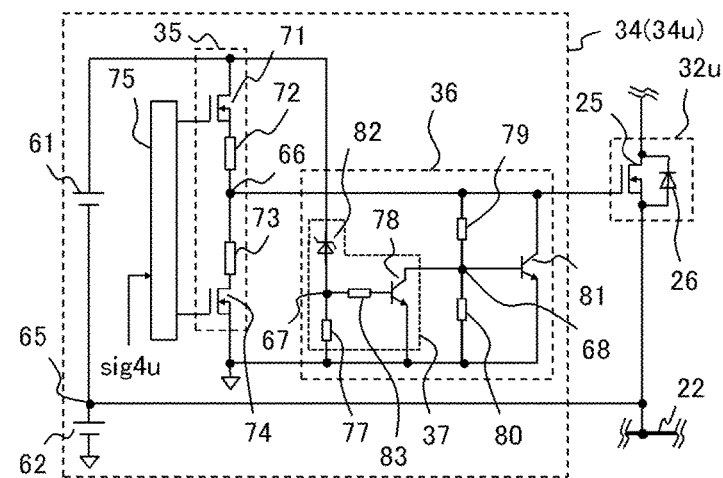
FIG. 8 is a circuit diagram showing a driving circuit according to Embodiment 2 of the invention.

FIG. 8 is a circuit diagram showing a driving circuit according to Embodiment 2 of the invention. The power-semiconductor element driving circuit 34 of Embodiment 2 is an example in which a temperature characteristic of the transistor 78 for detecting whether or not the sum voltage of the second DC power supply 61 and the third DC power supply 62 falls below the specified value, is taken into consideration. The driving circuit 34 of Embodiment 2 differs from that of Embodiment 1 in that variation in the operation of the transistor 78 depending on the temperature characteristic of the transistor 78 can be reduced or almost eliminated.

In FIG. 8, with respect to the configuration elements that are the same as or equivalent to those in the configuration shown in FIG. 2, the same reference numerals are given thereto. Here, description will be made focusing on the parts specific to Embodiment 2. In FIG. 8, as a substitute for the resistor 76 shown in FIG. 2, a zener diode 82 that is a voltage regulator element is used. The voltage detection circuit 37 in Embodiment 2 includes the zener diode 82, the transistor 78 and the resistors 77, 83. The positive side of the second DC power supply 61 and the cathode terminal of the zener diode 82 are connected to each other, and the anode terminal of the zener diode 82 is connected to one end of the resistor 77. One end of the resistor 83 is connected to a connection point 67 between the anode terminal of the zener diode 82 and the resistor 77, and the other end of the resistor 83 is connected to the base terminal of the transistor 78. The resistor 83 may be replaced with a wiring resistance.

In the thus-configured voltage detection circuit 37, the voltage applied to the transistor 78 is determined dominantly by the zener voltage of the zener diode 82, so that the influence due to the temperature characteristic in between the base and the emitter of the transistor 78 can be reduced or eliminated. The details will be described below.

Figure 9:
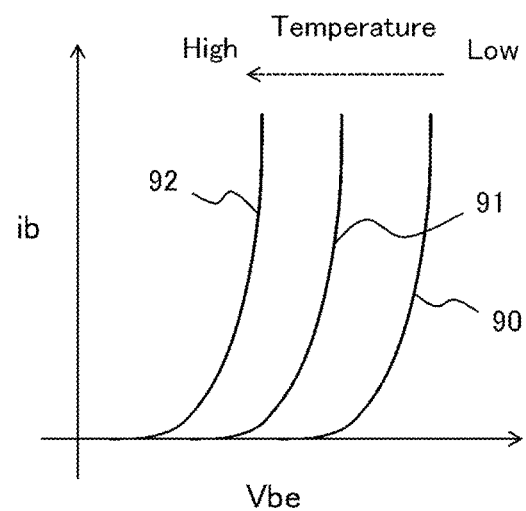
FIG. 9 is a graph showing a Vbe-ib characteristic of a bipolar transistor.

FIG. 9 is a graph showing a Vbe-ib characteristic of a bipolar transistor, which is a schematic diagram that represents a relationship between the voltage Vbe between the base and the emitter of the transistor 78 that is a bipolar transistor, and the base current ib. The abscissa represents the voltage Vbe between the base and the emitter, and the ordinate represents the base current ib. In FIG. 9, three characteristics 90, 91, 92 are shown, and as the temperature becomes higher, the characteristic 90 in the right side changes to the characteristic 91 or 92 in the left side. As is shown from FIG. 9, the higher the temperature, the lower the voltage between the base and emitter that allows the base current ib to flow. In general, at room temperature, the base current ib flows when the voltage between the base and the emitter is approx. 0.6 V, but there is a variation approximately from −0.2 V to +0.2 V over the operation-guaranteed range of the transistor 78. Thus, there is a possibility that a temperature change affects the operation of the low-threshold countermeasure circuit 36. The details will be described below using formulae.

First, the base current ib is calculated in the case where the configuration shown in FIG. 2 is used, namely, the transistor 76 is used. When the current flowing through the resistor 77 is defined as ir77 and the base current of the transistor 78 is defined as ib78, a formula (2) and a formula (3) are established.

$$(ir77+ib78)*R76+ir77*R77=V61+V62 \quad (2)$$

$$(ir77+ib78)*R76+Vbe78=V61+V62 \quad (3)$$

The formula (3) is a formula represented using the voltage Vbe78 between the base and emitter of the transistor 78.

When the base current ib78 is calculated from the formula (2) and the formula (3), a formula (4) is established.

$$ib78=\{(V61+V62)-A1*Vbe78\}/R76 \quad (4)$$

Note that A1 in the formula (4) is 1+R76/R77.

Next, the base current ib78 of the transistor 78 is represented by each of following formulae when the zener diode 82 in FIG. 8 is used. In the case of Condition 1, it is represented by a formula (5) and in the case of Condition 2, it is represented by a formula (6). In these, the voltage of the zener diode 82 is defined as Vz82.

$$V61+V62 \le Vz82+Vbe78 \quad \text{Condition 1:}$$

$$ib78=0 \quad (5)$$

$$V61+V62 > Vz82+Vbe78 \quad \text{Condition 2:}$$

$$ib78=\{(V61+V62)-(Vz82+Vbe78)\}/R83 \quad (6)$$

As is shown from the formula (5) and the formula (6), no base current ib78 flows until the sum of the voltages of the second DC power supply 61 and the third DC power supply 62 (V61+V62) exceeds the sum of the zener voltage Vz82 and the voltage Vbe78 between the base and the emitter of the transistor 78 (Vz82+Vbe78), namely, in the case of Condition 1. Thus, when the relationship in Condition 1 is satisfied, the transistor 78 does not operate. When the relationship in Condition 2 is satisfied, the base current ib78 begins to flow. At this time, although a change in Vbe78 occurs due to the temperature characteristic, because the value of Vz82 is generally larger than the value of Vbe78, the change in Vbe78 is negligible relative to the value of Vz82. Thus, according to the formula (6), ib78 is nearly unchanged relative to the change in Vbe78. Accordingly, because the driving circuit 34 of Embodiment 2 is configured by using the zener diode 82 in the voltage detection circuit 37, the variation in the operation of the transistor 78 depending on the temperature characteristic of the transistor 78 can be made smaller than that in Embodiment 1.

Although the zener voltage Vz82 of the zener diode 82 also has a temperature characteristic, when the values of Vz82 and Vbe78 are selected so that the temperature characteristic of the transistor 78 is negligible or nearly negligible relative to the zener diode 82 as described above, it is possible to reduce a temperature characteristic of ib78 or to make it zero. Thus, in comparison with Embodiment 1, the low-threshold countermeasure circuit 36 of Embodiment 2 can suppress the condition-dependent variation in the operation.

Note that in FIG. 8, the zener diode 82 is configured as a single element; however, this is not limitative. A plurality of same zener diodes may be connected in series or in parallel, or a plurality of different zener diodes may be connected in series or in parallel.

As described above, with such a configuration in which the zener diode 82 is used in the voltage detection circuit 37 for detecting a state of the sum voltage of the voltages of the second DC power supply 61 and the third DC power supply 62, the driving circuit 34 of Embodiment 2 can reduce the variation in the operation of the transistor 78 depending on the temperature characteristic of the transistor 78. Because the driving circuit 34 of Embodiment 2 can reduce the variation in the operation of the transistor 78 depending on the temperature characteristic of the transistor 78, even if a temperature change occurs, it is possible to protect the power semiconductor element more accurately than in Embodiment 1. Further, according to the driving circuit 34 of Embodiment 2, even in a state in which the operation temperature is changed, when the voltage change dv/dt occurs, the switching element (transistor 81) is turned on without an inverse voltage being applied between the main terminals (between the collector-emitter terminals) of the switching element (transistor 81), so that it is possible to prevent the false operation caused by a positive bias voltage charged between the gate and the source of the power semiconductor element (lower arm 32u) in OFF state, to thereby prevent the power semiconductor element, such as the lower arm 32u, the upper arm 31u or the like, from being broken due to the false operation, even without using an element having an inverse voltage-resistance characteristic as the switching element (transistor 81).

Embodiment 3

Figure 10:
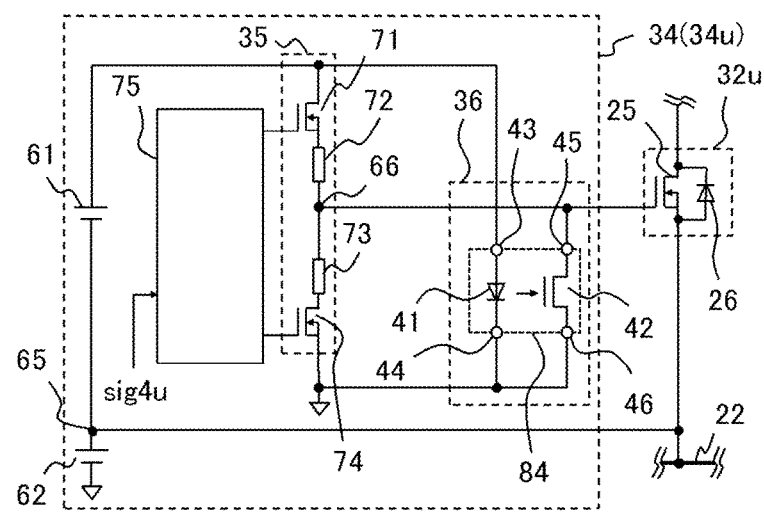
FIG. 10 is a circuit diagram showing a first driving circuit according to Embodiment 3 of the invention.

FIG. 10 is a circuit diagram showing a first driving circuit according to Embodiment 3 of the invention. The power-semiconductor element driving circuit 34 of Embodiment 3 differs from those of Embodiments 1 and 2 in that a normally-on-type relay 84 is used in the low-threshold countermeasure circuit 36. In FIG. 10, with respect to the configuration elements that are the same as or equivalent to those in the configuration shown in FIG. 2, the same reference numerals are given thereto. Here, description will be made focusing on the parts specific to Embodiment 3.

The normally-on-type relay 84 is a four-terminal device that includes a primary-side terminal pair consisting of primary-side terminals 43, 44 and a secondary-side terminal pair consisting of secondary-side terminals 45, 46. In a state where a current or voltage is not sufficiently supplied to the primary-side terminal pair, the secondary-side terminal pair is in a low-resistance state and the relay is turned on, so that it is referred to as of a normally-on type. In a state where a current or voltage is sufficiently supplied to the primary-side terminal pair, the secondary-side terminal pair is in a high-resistance state and the relay is turned off. In Embodiment 3, description will be made about a case of using the normally-on-type relay 84 whose primary side is configured with a light emitting diode 41 and whose secondary side is configured with a photo-MOSFET 42. The light emitting diode 41 in the primary side corresponds to the voltage detection circuits 37 in Embodiments 1 and 2, and the photo-MOSFET 42 in the secondary side corresponds to the transistors 81 in Embodiments 1 and 2. In the driving circuit 34 of Embodiment 3 in which the normally-on-type relay 84 is used, when the value of a detection target voltage that is a voltage between the primary-side terminal pair becomes lower than a voltage setting value, the voltage detector (light emitting diode 41) turns on the switching element (photo-MOSFET 42), to thereby supply, between the control terminal and the reference terminal in the power semiconductor element (lower arm 32u), a voltage of 0V or lower. As the normally-on-type relay 84, it is allowable to use a mechanical relay whose primary side is configured with a coil and whose secondary side is configured with a contact of a metal piece.

The primary-side terminal 43 of the normally-on-type relay 84 is connected to the positive side of the second DC power supply 61, and the primary-side terminal 44 is connected to the negative side of the third DC power supply 62. A resistor may be inserted in the middle of the wiring between the primary-side terminal 43 of the normally-on-type relay 84 and the positive side of the second DC power supply 61 or the wiring between the primary-side terminal 44 and the negative side of the third DC power supply 62. The insertion of the resistor in the middle of the wiring makes it possible to suppress an excess current flowing through the primary-side terminal pair. In FIG. 10, description will be made about the case where such a resistor is not inserted.

The secondary-side terminal 45 of the normally-on-type relay 84 is connected to the gate terminal of the lower arm 32u, and the secondary-side terminal 46 is connected to the negative side of the third DC power supply 62. A resistor may be inserted in the middle of the wiring between the secondary-side terminal 45 of the normally-on-type relay 84 and the gate terminal of the lower arm 32u or the wiring between the secondary-side terminal 46 and the negative side of the third DC power supply 62. The insertion of the resistor in the middle of the wiring makes it possible to suppress an excess current flowing through the secondary-side terminal pair. In FIG. 10, description will be made about the case where such a resistor is not inserted.

At a normal time, namely, when the sum voltage value of the second DC power supply 61 and the third DC power supply 62 is a specified value or more, a sufficient current and a sufficient voltage are supplied to the primary-side terminal pair of the normally-on-type relay 84. Thus, the secondary-side terminal pair of the normally-on-type relay 84 is in a high-resistance state, thus not impeding an increase in the gate voltage of the lower arm 32u.

At an abnormal time, namely, when the sum voltage value of the second DC power supply 61 and the third DC power supply 62 is lower than the specified value, neither a sufficient current nor a sufficient voltage is supplied to the primary-side terminal pair of the normally-on-type relay 84. Thus, the secondary-side terminal pair of the normally-on-type relay 84 is in a low-resistance state, so that the gate terminal of the lower arm 32u is electrically connected to the negative side of the third DC power supply 62. On this occasion, even if dv/dt emerges between the drain and the source of the lower arm 32u, the negative bias voltage is continued to be applied between the gate and the source of the lower arm 32u. Because the negative bias voltage is applied between the gate and the source of the lower arm 32u, the voltage increase therebetween is reduced promptly if the voltage between the gate-source terminals of the lower arm 32u increases. Thus, the voltage between the gate and the source of the lower arm 32u is suppressed to be lower than the threshold voltage of the lower arm 32u, so that the lower arm 32u can be kept in OFF state. Accordingly, if the voltage change dv/dt is applied between the drain-source terminals in the lower arm 32u in OFF state, there is no case where the lower arm 32u is falsely turned on (in a state of false ON), so that it is possible to prevent the lower arm 32u and the upper arm 31u from being broken due to such false ON.

As described above, with such a simplified circuit configuration in which the normally-on-type relay 84 is connected between the gate terminal of the lower arm 32u and the negative side of the third DC power supply 62, the driving circuit 34 of Embodiment 3 can achieve a function of preventing the power semiconductor element (lower arm 32u) from being broken by its false turning on, even without using an element having an inverse voltage-resistance characteristic as the photo-MOSFET 42 in the normally-on-type relay 84. According to the driving circuit 34 of Embodiment 3, when the voltage change dv/dt occurs, the switching element (the photo-MOSFET 42 in the normally-on-type relay 84) is turned on without an inverse voltage being applied between the main terminals (between the drain-source terminals) of the switching element (the photo-MOSFET 42 in the normally-on-type relay 84), so that it is possible to prevent the false operation caused by a positive bias voltage charged between the gate and the source of the power semiconductor element (lower arm 32u) in OFF state, to thereby prevent the power semiconductor element, such as the lower arm 32u, the upper arm 31u or the like, from being broken due to the false operation, even without using an element having an inverse voltage-resistance characteristic as the switching element (the photo-MOSFET 42 in the normally-on-type relay 84).

Figure 11:
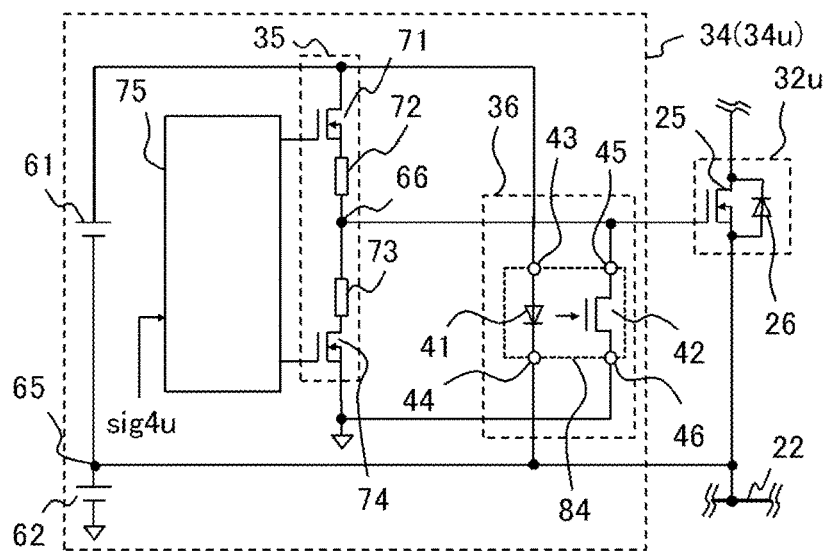
FIG. 11 is a circuit diagram showing a second driving circuit according to Embodiment 3 of the invention.

Note that the normally-on-type relay 84 may be connected in another manner. FIG. 11 is a circuit diagram showing a second driving circuit according to Embodiment 3 of the invention. In the normally-on-type relay 84 in FIG. 11, the primary-side terminal 43 is connected to the positive side of the second DC power supply 61, and the primary-side terminal 44 is connected to the negative side of the second DC power supply 61. The normally-on-type relay 84 in FIG. 11 is configured so as to monitor the voltage of the second DC power supply 61.

Figure 12:
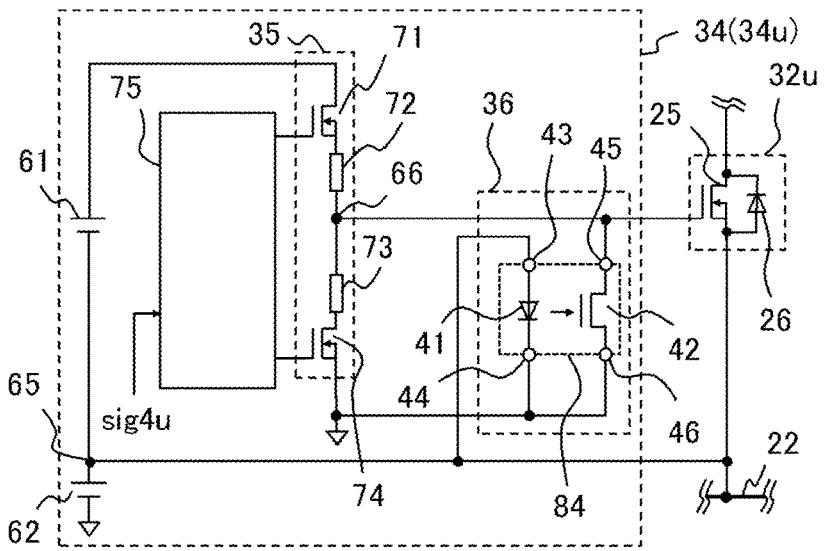
FIG. 12 is a circuit diagram showing a third driving circuit according to Embodiment 3 of the invention.

Further, the normally-on-type relay 84 may be connected in still another manner. FIG. 12 is a circuit diagram showing a third driving circuit according to Embodiment 3 of the invention. In the normally-on-type relay 84 in FIG. 12, the primary-side terminal 43 is connected to the positive side of the third DC power supply 62, and the primary-side terminal 44 is connected to the negative side thereof. The normally-on-type relay 84 in FIG. 12 is configured so as to monitor the third DC power supply 62.

As described above, the driving circuit 34 of Embodiment 3 comprises: a positive-voltage power supply (second DC power supply 61) for supplying, between a control terminal and a reference terminal in a power semiconductor element (lower arm 32u), a positive bias voltage; a negative-voltage power supply (third DC power supply 62) whose positive side is connected to the negative side of the positive-voltage power supply (second DC power supply 61), for supplying, between the control terminal and the reference terminal in the power semiconductor element (lower arm 32u), a negative bias voltage; the gate driving circuit 35 that supplies, based on the control signal sig4u of a control circuit (motor-drive control circuit 4), either the positive bias voltage for turning on the power semiconductor element (lower arm 32u) or the negative bias voltage for turning off the power semiconductor element (lower arm 32u), between the control terminal and the reference terminal in the power semiconductor element (lower arm 32u); a voltage detector (the light emitting diode 41 in the normally-on-type relay 84) that detects a detection target voltage that is a sum voltage of the positive bias voltage and the negative bias voltage, or the negative bias voltage; and a switching element (the photo-MOSFET 42 in the normally-on-type relay 84) that is connected to the control terminal of the power semiconductor element (lower arm 32u) and the negative side of the negative-voltage power supply (third DC power supply 62). The voltage detector (the light emitting diode 41 in the normally-on-type relay 84) in the driving circuit 34 of Embodiment 3 is characterized in that it turns on the switching element (the photo-MOSFET 42 in the normally-on-type relay 84) to thereby supply, between the control terminal and the reference terminal in the power semiconductor element (lower arm 32u), a voltage of 0V or lower, when the value of the detection target voltage becomes lower than the voltage setting value. Thus, if the voltage change dv/dt is applied, because the switching element (the photo-MOSFET 42 in the normally-on-type relay 84) is turned on without an inverse voltage being applied between the main terminals (between the drain-source terminals) of the switching element (the photo-MOSFET 42 in the normally-on-type relay 84), it is possible to prevent the false operation caused by a positive bias voltage charged between the control terminal and the reference terminal of the power semiconductor element (lower arm 32u) in OFF state, to thereby prevent a phenomenon that the power semiconductor element (lower arm 32u) is broken due to the false operation, even without using an element having an inverse voltage-resistance characteristic as the switching element (the photo-MOSFET 42 in the normally-on-type relay 84).

Embodiment 4

In the normally-on-type relay 84 described in Embodiment 3, since the primary-side terminal pair and the secondary-side terminal pair are electrically insulated to each other, the primary-side terminal pair may be connected to any given power supply present in the driving circuit 34. As a connection target for the primary-side terminal pair of the normally-on-type relay 84, it suffices to choose a power supply that is activated most slowly, a power supply that stops supplying most quickly or a power supply with a largest voltage-variation range at the abnormal time.

Figure 13:
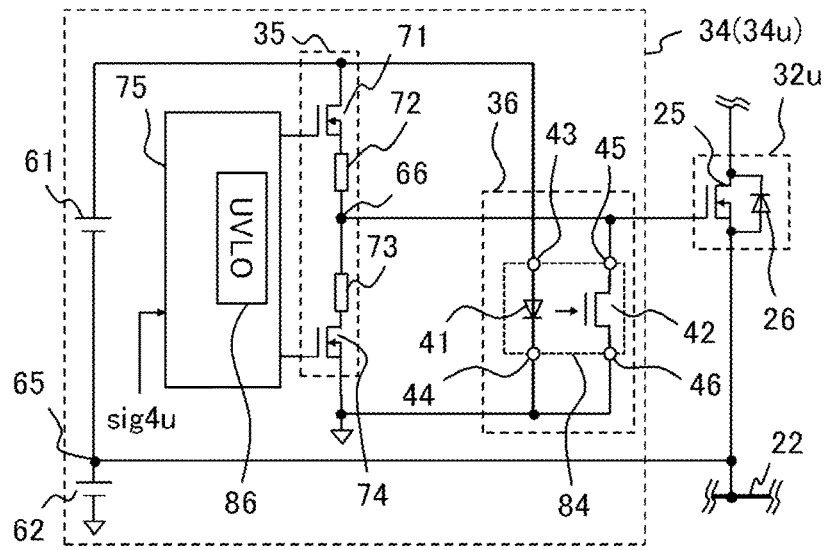
FIG. 13 is a circuit diagram showing a driving circuit according to Embodiment 4 of the invention.

Additionally to say that, as shown in FIG. 13, the buffer circuit 75 is desired to include a UVLO (Under Voltage Lock Out) section 86. FIG. 13 is a circuit diagram showing a driving circuit according to Embodiment 4 of the invention. The driving circuit 34 of Embodiment 4 differs from that of Embodiment 3 in that the buffer circuit 75 includes the UVLO section 86.

Such a case possibly occurs where the second DC power supply 61 or the third DC power supply 62 becomes abnormal when the control signal sig4u indicative of a turn-on order is inputted from the motor-drive control circuit 4 to the buffer circuit 75. If the buffer circuit 75 turns on the FET 71, the positive bias voltage is charged from the second DC power supply 61 through the resistor 72 into the input capacitance between the gate-source terminals of the lower arm 32u. When the second DC power supply 61 or the third DC power supply 62 is abnormal, although the low-threshold countermeasure circuit 36 is in a low-resistance state between the secondary-side terminal pair, the operation by the low-threshold countermeasure circuit 36 for reducing the increase in the gate voltage is impeded by the turn-on operation of the FET 71.

The UVLO section 86 is monitoring a power-supply voltage for the buffer circuit 75 and, when detects that the power-supply voltage for the buffer circuit 75 is low, prohibits the turn-on operation of the FET 71 by the buffer circuit 75, and makes switching to the turn-on operation of the FET 74 by the buffer circuit 75. When the UVLO section 86 detects that the power-supply voltage for the buffer circuit 75 is low, the buffer circuit 75 causes the turn-on operation of the FET 74 regardless of the turn-on order or the turn-off order from the motor-drive control circuit 4. Thus, such an effect is obtained that the operation by the low-threshold countermeasure circuit 36 for reducing the increase in the gate voltage is not impeded even when the second DC power supply 61 or the third DC power supply 62 becomes abnormal. Such a function possessed by the UVLO section 86 is, in some cases, referred to as an Under-Voltage Lock Out Function.

Figure 14:
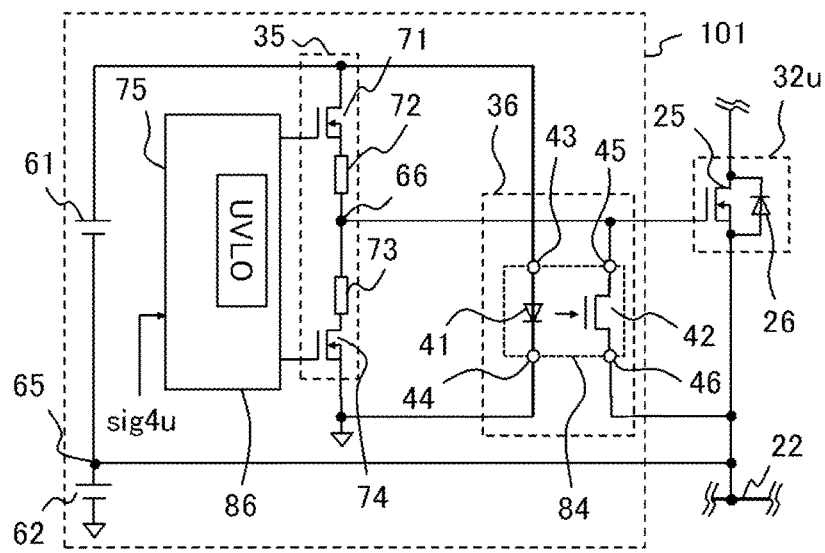
FIG. 14 is a circuit diagram showing a driving circuit as a comparative example relative to the driving circuit in FIG. 13.

In the driving circuit in Patent Document 1, an unfavorable problem arises when it includes the UVLO section 86. A comparative example will be described using FIG. 14. FIG. 14 is a circuit diagram showing a driving circuit as the comparative example relative to the driving circuit in FIG. 13. A driving circuit 101 of the comparative example in FIG. 14 differs from the driving circuit 34 in FIG. 13 in that the primary-side terminal 44 and the secondary-side terminal 46 of the normally-on-type relay 84 is connected to the source terminal of the lower arm 32u.

When the second DC power supply 61 or the third DC power supply 62 becomes abnormal, the gate terminal and the source terminal of the lower arm 32u are electrically connected to each other. At the same time, the turn-on operation of the FET 74 is caused by the ULVO section 86. As a result, such a path is established that passes through the positive side of the third DC power supply 62, the source terminal of the lower arm, the gate terminal of the lower arm 32u, the resistor 73, the FET 74 and the negative side of the third DC power supply 62. When this path is established, a risk arises that the resistor 73 may be heated abnormally upon receiving energy of the third DC power supply 62. Further, if at the time of activating the driving circuit 101, because an increase in the voltage of the third DC power supply 62 is impeded, a risk arises that the activation may be delayed.

According to the driving circuit 34 of Embodiment 4 of the invention, the secondary-side terminal 45 of the normally-on-type relay 84 is connected to the gate terminal of the lower arm 32u, and the secondary-side terminal 46 is connected to the negative side of the third DC power supply 62. When the second DC power supply 61 or the third DC power supply 62 becomes abnormal, the normally-on-type relay 84 operates, so that the gate of the lower arm 32u and the negative side of the third DC power supply 62 are electrically connected to each other. If the turn-on operation of the FET 74 is caused by the UVLO section 86, such a path is not established that passes through the positive side and the negative side of the third DC power supply 62 and the FET 74. Thus, according to the driving circuit 34 of Embodiment 4, there is no risk that the resistor 73 may be heated abnormally. Further, according to the driving circuit 34 of Embodiment 4, there is no risk that an increase in the voltage of the third DC power supply 62 is impeded at the time of activation. As thus described, the driving circuit 34 of Embodiment 4 has a feature of not causing such an unfavorable problem that is caused by the driving circuit in Patent Document 1, while receiving the benefit of including the UVLO section 86.

As described above, the UVLO section 86 may be included in the driving circuit 34 of Embodiment 4, so that, even when the second DC power supply 61 or the third DC power supply 62 is abnormal, it is possible to prevent the false ON of the power semiconductor element (lower arm 32u) without causing abnormal heat-up of the resistor 73, to thereby prevent the power semiconductor element, such as the lower arm 32u, the upper arm 31u or the like, from being broken due to the false ON, even without using an element having an inverse voltage-resistance characteristic as the photo-MOSFET 42 in the normally-on-type relay 84. Note that the UVLO section 86 may also be included in the driving circuit 34 of Embodiment 1 or 2. The driving circuit 34 of Embodiment 1 or 2 including the UVLO section 86 does not cause such an unfavorable problem that is caused by the driving circuit in Patent Document 1, while receiving the benefit of including the UVLO section 86.

The driving circuits 34 of Embodiments 1 to 4 are each applicable not only to an electric drive system in which DC power is converted to AC power, for driving a motor 5, but also to a case in which AC power is converted to DC power. Further, unlimited combination of the respective embodiments, and appropriate modification and omission in the embodiments may be made in the present invention without departing from the scope of the invention.

DESCRIPTION OF REFERENCE NUMERALS AND SIGNS

4: motor-drive control circuit, 31u, 31v, 31w: upper arm (power semiconductor element), 32u, 32v, 32w: lower arm (power semiconductor element), 34, 34u, 34v, 34w: low potential-side driving circuit (driving circuit), 35: gate driving circuit, 37: voltage detection circuit (voltage detector), 43: primary-side terminal, 44: primary-side terminal, 45: secondary-side terminal, 46: secondary-side terminal, 61: second DC power supply, 62: third DC power supply, 63: diode, 67: connection point, 71: FET (positive-side transistor), 74: FET (negative-side transistor), 75: buffer circuit, 76: resistor, 77: resistor, 78: transistor, 81: transistor, 82: zener diode (voltage regulator element), 84: normally-on-type relay, 85: resistor, 86: UVLO section, sig4u, sig4v, sig4w: control signal.

The invention claimed is:

1. A power-semiconductor element driving circuit for driving a power semiconductor element, comprising:
    a positive-voltage power supply for supplying, between a control terminal and a reference terminal in the power semiconductor element, a positive bias voltage;
    a negative-voltage power supply for supplying, between the control terminal and the reference terminal in the power semiconductor element, a negative bias voltage, a positive side of which is connected to a negative side of said positive-voltage power supply;
    a gate driving circuit that supplies, based on a control signal of a control circuit, either the positive bias voltage for turning on the power semiconductor element or the negative bias voltage for turning off the power semiconductor element, between the control terminal and the reference terminal in the power semiconductor element;
a voltage detector that detects a detection target voltage that is a sum voltage of the positive bias voltage and the negative bias voltage, the negative bias voltage or the positive bias voltage; and
a switching element that is connected to the control terminal of the power semiconductor element and a negative side of the negative-voltage power supply; and
a first element and a second element that are serially connected together,
wherein a connection point between the first element and the second element is connected to a control terminal of the switching element and the voltage detector,
wherein another end of the second element that is other than at the connection point between the first element and the second element is connected to the negative side of the negative-voltage power supply,
wherein another end of the first element that is other than at the connection point between the first element and the second element is connected to the control terminal of the power semiconductor element, and
wherein, when a value of the detection target voltage becomes lower than a voltage setting value or when a voltage between the control terminal and the reference terminal in the power semiconductor element increases in a state where the value of the detection target voltage is lower than the voltage setting value, the voltage detector turns on the switching element to thereby supply, between the control terminal and the reference terminal in the power semiconductor element, a voltage of 0V or lower.

2. The power-semiconductor element driving circuit of claim 1, wherein the switching element is driven, at the time it is turned on, by a voltage between the control terminal of the power semiconductor element and the negative side of the negative-voltage power supply.

3. The power-semiconductor element driving circuit of claim 1, wherein:
the voltage detector comprises a first resistor and a second resistor that are serially connected together, and a transistor whose control terminal is connected to a connection point between the first resistor and the second resistor;
another end of the first resistor that is other than at the connection point is connected to the positive side of the positive-voltage power supply or the positive side of the negative-voltage power supply;
another end of the second resistor that is other than at the connection point, and a reference terminal of the transistor are connected to the negative side of the negative-voltage power supply; and
an output terminal of the transistor is connected to a control terminal of the switching element.

4. The power-semiconductor element driving circuit of claim 1 wherein:
the voltage detector comprises a voltage regulator element and a resistor that are serially connected together, and a transistor whose control terminal is connected to a connection point between an anode terminal of the voltage regulator element and the resistor;
a cathode terminal of the voltage regulator element is connected to the positive side of the positive-voltage power supply or the positive side of the negative-voltage power supply;
another end of the resistor that is other than at the connection point, and a reference terminal of the transistor are connected to the negative side of the negative-voltage power supply; and
an output terminal of the transistor is connected to a control terminal of the switching element.

5. The power-semiconductor element driving circuit of claim 1, further comprising a diode whose cathode terminal is connected to the positive side of the negative-voltage power supply and whose anode terminal is connected to the negative side of the negative-voltage power supply.

6. The power-semiconductor element driving circuit of claim 1, further comprising a resistor between the control terminal of the power semiconductor element and the positive side of the negative-voltage power supply.

7. The power-semiconductor element driving circuit of claim 1, wherein:
the gate driving circuit comprises a positive-side transistor that supplies or interrupts supplying, between the control terminal and the reference terminal of the power semiconductor element, the positive bias voltage, and a negative-side transistor that supplies or interrupts supplying, between the control terminal and the reference terminal of the power semiconductor element, the negative bias voltage;
a buffer circuit for turning on/off the positive-side transistor and the negative-side transistor based on the control signal of the control circuit is provided, said buffer circuit including a UVLO section; and
the UVLO section turns off the positive-side transistor and turns on the negative-side transistor, when a voltage supplied to the buffer circuit from the positive-voltage power supply or the negative-voltage power supply, is lower than a setting value.

8. The power-semiconductor element driving circuit of claim 1, wherein the power semiconductor element is formed of a wide bandgap semiconductor material.

9. The power-semiconductor element driving circuit of claim 8, wherein the wide bandgap semiconductor material is silicon carbide, a gallium nitride-based material or diamond.

10. The power-semiconductor element driving circuit of claim 1, wherein the voltage detector turns on the switching element when, in the case where the negative-voltage power supply supplies the negative bias voltage to the control terminal in the power semiconductor element, the value of the detection target voltage becomes lower than the voltage setting value, or when, in the case where the negative-voltage power supply supplies the negative bias voltage to the control terminal in the power semiconductor element, the voltage between the control terminal and the reference terminal in the power semiconductor element increases in a state where the value of the detection target voltage is lower than the voltage setting value.

11. The power-semiconductor element driving circuit of claim 10, wherein the switching element is driven, at the time it is turned on, by a voltage between the control terminal of the power semiconductor element and the negative side of the negative-voltage power supply.

12. The power-semiconductor element driving circuit of claim 1, wherein the voltage detector detects the sum voltage of the positive bias voltage and the negative bias voltage, as the detection target voltage.

13. The power-semiconductor element driving circuit of claim 12, wherein the voltage detector includes: a third element and a fourth element that are serially connected together, and a transistor whose control terminal is connected to a connection point between the third element and the fourth element; and wherein another end of the third element that is other than at said connection point is connected to the positive side of the positive-voltage power supply.

14. The power-semiconductor element driving circuit of claim 1, wherein the switching element that is connected to the control terminal of the power semiconductor element and a negative side of the negative-voltage power supply and is off when the value of the detection target voltage is equal to or higher than a voltage setting value.

15. The power-semiconductor element driving circuit of claim 1, wherein the switching element that has a first terminal, a second terminal, and a third terminal for controlling on/off switching according to a voltage between said second terminal and said third terminal, in which the first terminal is connected to the control terminal of the power semiconductor element and the second terminal is connected to a negative side of the negative-voltage power supply.

16. The power-semiconductor element driving circuit of claim 1, wherein the first element and the second element are each a resistor.

17. A power-semiconductor element driving circuit for driving a power semiconductor element, comprising:
a positive-voltage power supply for supplying, between a control terminal and a reference terminal in the power semiconductor element, a positive bias voltage;
a negative-voltage power supply for supplying, between the control terminal and the reference terminal in the power semiconductor element, a negative bias voltage, a positive side of which is connected to a negative side of said positive-voltage power supply;
a gate driving circuit that supplies, based on a control signal of a control circuit, either the positive bias voltage for turning on the power semiconductor element or the negative bias voltage for turning off the power semiconductor element, between the control terminal and the reference terminal in the power semiconductor element;
a voltage detector that detects a detection target voltage that is a sum voltage of the positive bias voltage and the negative bias voltage, or the positive bias voltage; and
a switching element that is connected to the control terminal of the power semiconductor element and a negative side of the negative-voltage power supply;
wherein:
the switching element and the voltage detector are configured with a normally-on-type relay;
a first primary-side terminal of the normally-on-type relay is connected to the positive side of the positive-voltage power supply or the positive side of the negative-voltage power supply;
a second primary-side terminal of the normally-on-type relay is connected to the negative side of the negative-voltage power supply or the positive side of the negative-voltage power supply;
a first secondary-side terminal of the normally-on-type relay is connected to the control terminal of the power semiconductor element; and
a second secondary-side terminal of the normally-on-type relay is connected to the negative side of the negative-voltage power supply; and
wherein, when a value of the detection target voltage becomes lower than a voltage setting value, the voltage detector supplies, between the control terminal and the reference terminal in the power semiconductor element, a voltage of 0V or lower.

* * * * *